United States Patent
Cui

(10) Patent No.: US 10,416,718 B2
(45) Date of Patent: Sep. 17, 2019

(54) FLEXIBLE DISPLAY PANEL AND FLEXIBLE DISPLAY APPARATUS

(71) Applicant: Wuhan China Star Optoelectronics Technology Co., Ltd., Wuhan, Hubei (CN)

(72) Inventor: Lei Cui, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 198 days.

(21) Appl. No.: 15/324,024

(22) PCT Filed: Nov. 15, 2016

(86) PCT No.: PCT/CN2016/105932
§ 371 (c)(1),
(2) Date: Jan. 5, 2017

(87) PCT Pub. No.: WO2018/076411
PCT Pub. Date: May 3, 2018

(65) Prior Publication Data
US 2018/0330696 A1    Nov. 15, 2018

(30) Foreign Application Priority Data
Oct. 24, 2016   (CN) .......................... 2016 1 0925476

(51) Int. Cl.
| G06F 1/16 | (2006.01) |
| H01L 51/00 | (2006.01) |
| G09F 9/30 | (2006.01) |
| G06F 3/14 | (2006.01) |
| G06F 3/041 | (2006.01) |
| H01L 27/32 | (2006.01) |
| G09G 3/20 | (2006.01) |

(52) U.S. Cl.
CPC .......... *G06F 1/1641* (2013.01); *G06F 3/1446* (2013.01); *G09F 9/301* (2013.01);
(Continued)

(58) Field of Classification Search
CPC ...... G06F 1/1652; G06F 1/1643; G06F 1/181; G06F 1/183; G06F 1/1635; G06F 1/1633;
(Continued)

(56) References Cited

U.S. PATENT DOCUMENTS

| 10,168,737 B2* | 1/2019 | Kemppinen | .......... G06F 1/1643 |
| 2012/0038570 A1* | 2/2012 | Delaporte | ............ G06F 1/1616 345/173 |

(Continued)

FOREIGN PATENT DOCUMENTS

| CN | 201409149 Y | 2/2010 |
| CN | 102855821 A | 1/2013 |

(Continued)

*Primary Examiner* — Julie Anne Watko
(74) *Attorney, Agent, or Firm* — Andrew C. Cheng

(57) ABSTRACT

The present application discloses a flexible display panel, including a non display part, a first screen, a second screen and a third screen, and the first screen and the second screen are oppositely located, and the third screen is connected between the first screen and the second screen, and the first screen, the second screen and the third screen form a continuous display region together, and the non display part is connected to one side of the display region, and the non display part is employed to be installed with a drive chip, and the drive chip is employed to drive the first screen, the second screen and the third screen to show images.

7 Claims, 3 Drawing Sheets

(52) U.S. Cl.
CPC ............ *G09G 3/20* (2013.01); *H01L 27/323* (2013.01); *H01L 51/0097* (2013.01); *G06F 1/1643* (2013.01); *G06F 3/0416* (2013.01); *G06F 2203/04102* (2013.01); *G09G 2300/026* (2013.01); *G09G 2300/04* (2013.01); *G09G 2380/02* (2013.01); *H01L 27/3244* (2013.01); *H01L 2251/5338* (2013.01)

(58) Field of Classification Search
CPC ........ G06F 1/1613; G06F 1/1601; G06F 1/00; G06F 3/0416; G06F 3/0412; G06F 3/041; G06F 3/03; G06F 3/02; G06F 3/01; G06F 3/00; G06F 2203/04102; G06F 2203/041; G06F 2203/00; G06F 1/1641; G06F 3/1446; G09G 5/14; G09G 5/12; G09G 5/04; G09G 5/006; G09G 5/003; G09G 5/00; G09G 2380/02; G09G 2380/00; G09G 2380/14; G09G 3/20; G09G 2300/026; G09G 2300/04; G09F 9/301; H01L 2251/5338; H01L 2251/5307; H01L 2251/53; H01L 2251/50; H01L 2251/00; H01L 1/0097; H01L 1/0096; H01L 1/00; H01L 27/3244; H01L 27/3241; H01L 27/323; H01L 27/3225; H01L 27/3223; H01L 27/32; H01L 27/28; H01L 27/00

See application file for complete search history.

(56) References Cited

U.S. PATENT DOCUMENTS

| | | | | |
|---|---|---|---|---|
| 2012/0062447 A1* | 3/2012 | Tseng | ................ | G02F 1/133305 345/33 |
| 2015/0043174 A1* | 2/2015 | Han | ................... | G02F 1/13452 361/749 |
| 2015/0062466 A1 | 3/2015 | Yun | | |
| 2015/0169006 A1* | 6/2015 | Chong | .................... | G09G 3/20 345/173 |
| 2015/0198978 A1* | 7/2015 | Catchpole | ............ | G06F 1/1632 345/173 |
| 2015/0227248 A1* | 8/2015 | Yamazaki | ............. | G06F 3/0412 345/173 |
| 2015/0257290 A1* | 9/2015 | Lee | ..................... | H04M 1/0216 361/749 |
| 2015/0261259 A1* | 9/2015 | Endo | ..................... | G06F 1/1652 361/679.06 |
| 2016/0202781 A1* | 7/2016 | Kim | ..................... | G06F 1/1652 345/173 |
| 2016/0266691 A1* | 9/2016 | Jang | ........................ | G06F 3/044 |
| 2016/0323966 A1* | 11/2016 | Hamel | .................. | H05B 33/26 |
| 2018/0027673 A1* | 1/2018 | Andou | ............... | H01L 27/3276 361/749 |
| 2018/0129330 A1* | 5/2018 | Ding | ..................... | G06F 3/0412 |
| 2018/0217691 A1* | 8/2018 | Cui | ......................... | G06F 3/041 |

FOREIGN PATENT DOCUMENTS

| | | | |
|---|---|---|---|
| CN | 104347000 A | | 2/2015 |
| CN | 104715682 A | | 6/2015 |
| CN | 104715692 A | | 6/2015 |
| CN | 204515586 U | | 7/2015 |
| CN | 104900149 A | | 9/2015 |
| CN | 204808769 U | | 11/2015 |
| CN | 105513501 A | * | 4/2016 |
| CN | 105513501 A | | 4/2016 |
| CN | 105529349 A | | 4/2016 |
| CN | 105788460 A | | 7/2016 |
| TW | 201211959 A | | 3/2012 |

\* cited by examiner

FLEXIBLE DISPLAY PANEL AND FLEXIBLE DISPLAY APPARATUS

CROSS REFERENCE

This application claims the priority of Chinese Patent Application No. 201610925476.5, entitled "Flexible display panel and flexible display apparatus", filed on Oct. 24, 2016, the disclosure of which is incorporated herein by reference in its entirety.

FIELD OF THE INVENTION

The present application relates to a display technology field, and more particularly to a flexible display panel and a flexible display apparatus.

BACKGROUND OF THE INVENTION

With the constant improvement of the display technology, the application of the flexible display screen has already become wider and wider. The flexible display screen is a display screen utilizing flexible plastic, and at present is realized with an Organic Light-Emitting Diode (OLED). In comparison with the regular flat panel screen, the elasticity of the flexible display screen is better, and the screen is hard to be broken, and the appearance is novel for easily attracting consumers. How to reasonably design the structure of the flexible display screen and to be applied on the display apparatuses, such as the cell phone, the tablet is the research point of the display technology in the future.

In prior art, the flexible display screen for the display apparatuses, such as the cell phone, the tablet is merely that a bending with a small radius of curvature at the edge of the display screen, and the structure of the flexible display screen is simple, and the image display region is small and multifunction of image display cannot be realized.

SUMMARY OF THE INVENTION

The present application provides a flexible display panel and a flexible display apparatus to solve the issues that the structure of the flexible display screen is simple, and the image display region is small and multifunction of image display cannot be realized.

A flexible display panel, comprising a non display part, a first screen, a second screen and a third screen, and the first screen and the second screen are oppositely located, and the third screen is connected between the first screen and the second screen, and the first screen, the second screen and the third screen form a continuous display region together, and the non display part is connected to one side of the display region, and the non display part is employed to be installed with a drive chip, and the drive chip is employed to drive the first screen, the second screen and the third screen to show images.

The flexible display panel further comprises a first bent part and a second bent part, and the first bent part is connected to the first screen and the third screen, and the second bent part is connected to the second screen and the third screen.

A metal line is configured in either of the first bent part and the second bent part, and the metal lines electrically connect the first screen, the second screen and the third screen.

Either of the first screen, the second screen and the third screen is coated with a transparent conductive thin film layer, which is employed to form touch control units, and the non display part is configured with a touch control chip, and the touch control chip is electrically connected to the touch control units to realize a touch control function of the flexible display panel.

A flexible display apparatus, comprising a main body and a flexible display panel, and the flexible display panel comprises a non display part, a first screen, a second screen and a third screen, and the first screen and the second screen are oppositely located, and the third screen is connected between the first screen and the second screen, and the first screen, the second screen and the third screen form a continuous display region together, and the non display part is connected to one side of the display region, and the non display part is employed to be installed with a drive chip, and the drive chip is employed to drive the first screen, the second screen and the third screen to show images, and the main body comprises a front side, a rear side and a lateral side connecting the front side and the rear side, and the first screen is adhered to the front side, and the second screen is adhered to the rear side, and the third screen is located on the lateral side after being bent.

The flexible display panel further comprises a first bent part and a second bent part, and the first bent part is connected to the first screen and the third screen, and the second bent part is connected to the second screen and the third screen.

A metal line is configured in either of the first bent part and the second bent part, and the metal lines electrically connect the first screen, the second screen and the third screen.

Either of the first screen, the second screen and the third screen is coated with a transparent conductive thin film layer, which is employed to form touch control units, and the non display part is configured with a touch control chip, and the touch control chip is electrically connected to the touch control units to realize a touch control function of the flexible display panel.

The main body comprises a system main board, and the system main board is connected to the flexible display panel through a flexible circuit board and controls the drive chip to drive the flexible display panel to show images.

The flexible display apparatus further comprises a glass panel covering on the flexible display panel, which is employed to protect the flexible display panel.

The glass panel comprises a first part, a second part and a third part connecting the first part and the second part, and the first part and the second part are oppositely located, and the first part covers the first screen, and the second part covers the second screen, and the third part covers the third screen.

The flexible display apparatus further comprises a lateral side outer shell, and the first part comprises a first edge away from the third part, and the second part comprises a second edge away from the third part, and the lateral side outer shell connects the first edge and the second edge, and the lateral side outer shell and a sectional side of the glass panel form an enclosed pattern and accommodate the main body and the flexible display panel inside.

The main body further comprises a battery, and the battery is installed in a battery jar of the system main board, and located between the system main board and the second screen.

The beneficial effect of the present application is: the first screen, the second screen and the third screen are respectively located at the front side, the rear side and the lateral side of the display apparatus to enlarge the display region of the flexible display screen; the first screen, the second screen and the third screen form a continuous display region together and can independently show images to realize the multifunction display and the appearance is novel to attract consumers.

BRIEF DESCRIPTION OF THE DRAWINGS

In order to more clearly illustrate the embodiments of the present invention, the following figures will be described in the embodiments are briefly introduced. It is obvious that the drawings are only some embodiments of the present invention, those of ordinary skill in this field can obtain other figures according to these figures without paying the premise.

DETAILED DESCRIPTION OF PREFERRED EMBODIMENTS

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of ordinary skill in the premise of no creative efforts obtained, should all be considered within the scope of protection of the present application.

Figure 1:
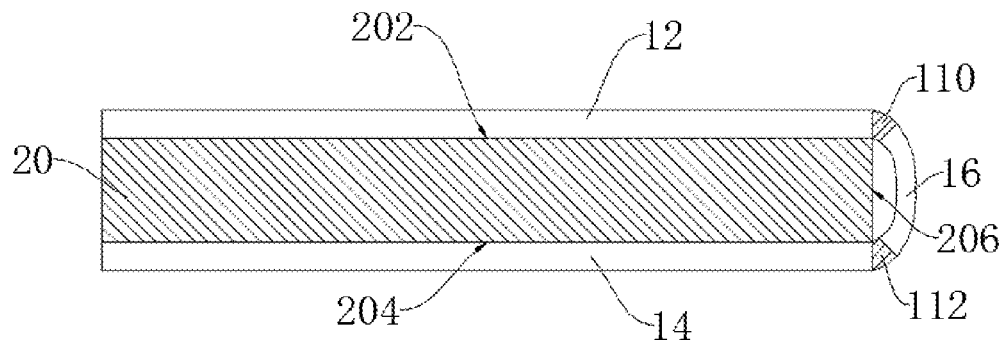
FIG. 1 is a sectional view diagram of a flexible display panel provided by the first embodiment of the present application.
Figure 2:
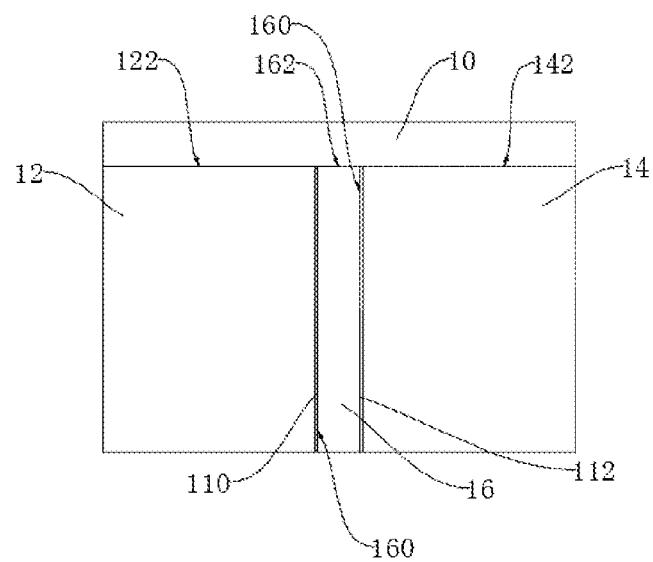
FIG. 2 is an expand view diagram of a flexible display panel provided by the first embodiment of the present application.

Please refer to FIG. 1 and FIG. 2. A flexible display panel comprises a non display part 10, a first screen 12, a second screen 14 and a third screen 16, and the third screen 16 is connected to the first screen 12 and the second screen 14, and the first screen 12, the second screen 14 and the third screen 16 form a continuous display region together, and the non display part is connected to one side of the display region. Specifically, the third screen 16 comprises a pair of long sides 160 and a third short side 162 between the pair of long sides 160, and the pair of long sides 160 are respectively connected to the first screen 12 and the second screen 14, and the first screen 12 comprises a first short side 122, and the second screen 14 comprises a second short side 142, wherein the first short side 122, the second short side 142 and the third short side 162 are collinear, and the first short side 122, the second short side 142 and the third short side 162 are connected end to end to form the edge of the non display part 10, i.e. the connection line of the non display part 10 and the display region. The non display part 10 is installed with the drive chip by welding or using Anisotropic Conductive Film (ACF). The drive chip is electrically connected to the internal circuit wirings of the first screen 12, the second screen 14 and the third screen 16 through the internal wirings of the non display part 10 and employed to drive the first screen 12, the second screen 14 and the third screen 16 to show images. Furthermore, the drive chip is connected to the data lines and the scan lines of the Thin Film Transistors (TFT) layer of the first screen 12, the second screen 14 and the third screen 16, and controls the switch states of the TFTs of the respective pixel units to control the first screen 12, the second screen 14 and the third screen 16 to show images.

In this embodiment, the third screen 16 is the bent part of the flexible display panel. The first screen 12 and the second screen 14 are respectively adhered on the front surface 202 and the rear surface 204 opposite on the main body 20 of the display apparatus. The third screen 16 is on the lateral side 206 connecting the front surface 202 and the rear surface 204, wherein the third screen 16 is in a bent status and can be not completely adhered to the lateral side 206. In one embodiment, the third screen 16 is bent to be an arc. The first screen 12, the second screen 14 and the third screen 16 are respectively located at the front surface 202, the rear surface 204 and the lateral side 206 to enlarge the display region of the flexible display screen; the first screen 12, the second screen 14 and the third screen 16 are driven to work with the drive chip of the non display part 10 and can independently show images to realize the multifunction display, and the appearance is novel to attract consumers.

Preferably, the flexible display panel is manufactured with Active-matrix organic light emitting diode (AMOLED). The AMOLED possesses merits of wide color gamut, high contrast, lower power consumption and light structure, and is suitable to manufacture the flexible display screen.

In this embodiment, the flexible display panel further comprises a first bent part 110 and a second bent part 112, and the first bent part 110 is connected to the first screen 12 and the third screen 16, and the second bent part 112 is connected to the second screen 14 and the third screen 16. Specifically, the pair of long sides 160 of the third screen 16 are respectively connected to the first bent part 110 and the second bent part 112, and are connected to the first screen 12 and the second screen 14 through the first bent part 110 and the second bent part 112. Specifically, the first bent part 110 and the second bent part 112 are manufactured with plastic material of better bendability. On one hand, they are employed to bear the most of the bent stress of the bent angles. On the other hand, they are employed to separate the first screen 12, the second screen 14 and the third screen 16.

Furthermore, both the first bent part 110 and the second bent part 112 are configured with metal lines inside. The metal lines are connected to the data lines and the scan lines of the first screen 12, the second screen 14 and the third screen 16 so that the first screen 12, the second screen 14 and the third screen 16 are electrically connected with one another, and employed to drive the chip to drive the first screen 12, the second screen 14 and the third screen 16 to show images at the same time.

In this embodiment, according to the difference of the drive way of the drive chip, the first screen 12, the second screen 14 and the third screen 16 can realize the multifunction display. Specifically, the display panel comprises at least two display modes, which respectively are: the drive chip outputs the same data signal to synchronously drive the first screen 12, the second screen 14 and the third screen 16 show different parts of the same image, wherein the first screen 12, the second screen 14 and the third screen 16 respectively show the different regions of the same image, and the images of the first screen 12, the second screen 14 and the third screen 16 combine to be a complete image to enlarge the display region of the display apparatus for providing a better usage experience to the user; the drive chip outputs the different data signals to respectively and independently drive the first screen 12, the second screen 14 and the third screen 16 show different images, i.e. the first screen 12, the second screen 14 and the third screen 16 respectively shows irrelevant images, and the user can receive more image information. Moreover, one display apparatus can provide different image information to many people at the same time.

In this embodiment, either of the first screen 12, the second screen 14 and the third screen 16 is coated with a transparent conductive thin film layer, which is employed to form touch control units, and the non display part 10 is configured with a touch control chip, and the touch control chip is electrically connected to the touch control units to realize a touch control function of the flexible display panel. Preferably, the transparent conductive thin film layer is an Indium Tin Oxide (ITO) conductive thin film layer.

The first screen 12, the second screen 14 and the third screen 16 are respectively located at the front surface 202, the rear surface 204 and the lateral side 206 to enlarge the display region of the flexible display panel; the first screen 12, the second screen 14 and the third screen 16 are driven to work with the drive chip of the non display part 10 and can independently show images to realize the multifunction display, and the appearance is novel to attract consumers.

Figure 3:
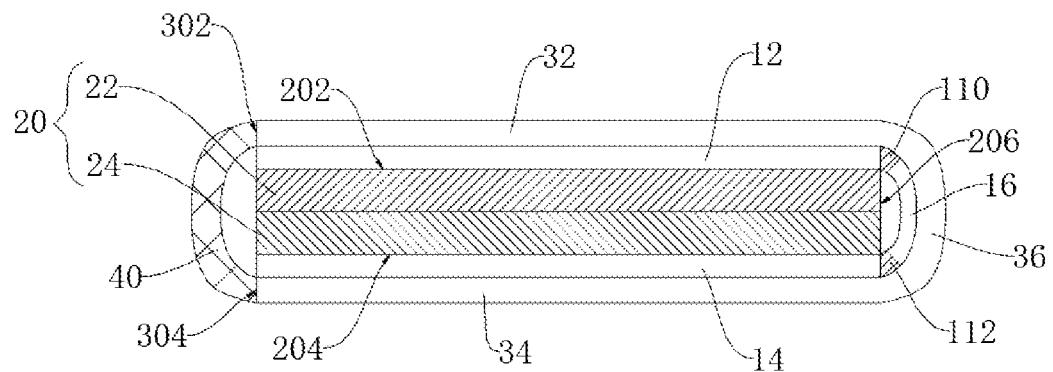
FIG. 3 is a sectional view diagram of a flexible display apparatus provided by the first embodiment of the present application.
Figure 4:
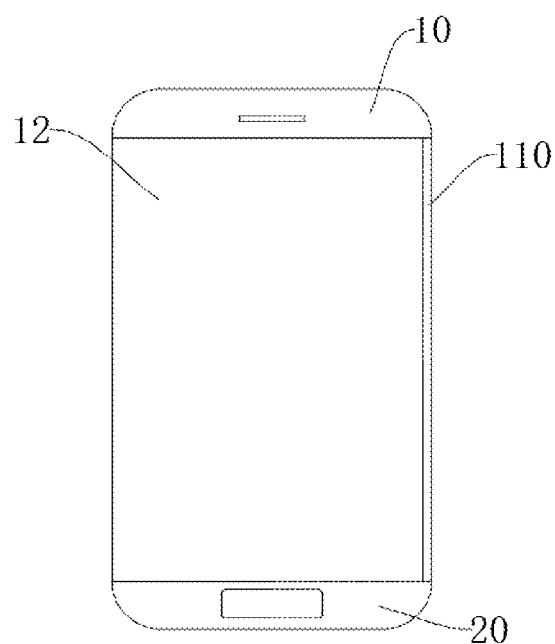
FIG. 4 is a front view diagram of a flexible display apparatus provided by the first embodiment of the present application.
Figure 5:
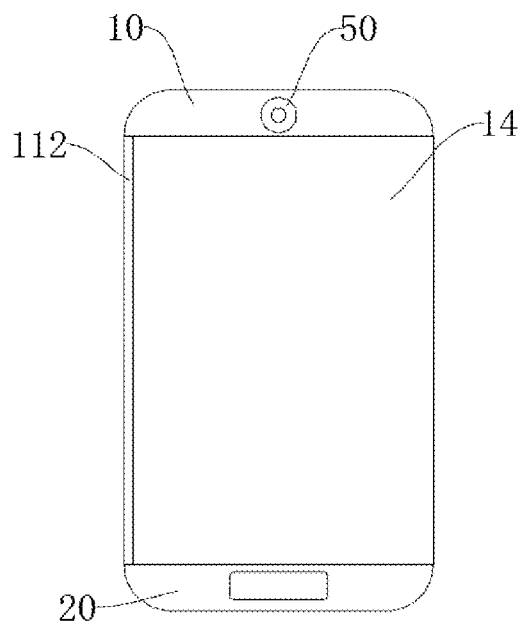
FIG. 5 is a rear view diagram of a flexible display apparatus provided by the first embodiment of the present application.

Please refer to FIG. 3, FIG. 4 and FIG. 5. The flexible display apparatus provided by the first embodiment of the present application comprises a main body 20 and the aforesaid flexible display panel. The main body 20 comprises a front side 202, a rear side 204 and a lateral side 206 connecting the front side 202 and the rear side 204, and the first screen 12 is adhered to the front side 202, and the second screen 14 is adhered to the rear side 204, and the third screen 16 is located on the lateral side 26 after being bent. The first screen 12, the second screen 14 and the third screen 16 are respectively located at the front surface 202, the rear surface 204 and the lateral side 206 of the main body 20 to enlarge the display region of the flexible display apparatus, and to independently show images to realize the multifunction display.

In this embodiment, the main body 20 comprises a system main board 22, and the system main board 22 is connected to the flexible display panel through a flexible circuit board and controls the drive chip to drive the flexible display panel to show images. Specifically, one end of the flexible circuit board is connected to the system main board 22, and the other end is connected to the non display part 10 of the flexible display panel, and thus the system main board 22 and the drive chip are electrically connected. In the image showing progress of the flexible display apparatus, the system main board 22 sends signals, such as the sequence signal to the drive chip. The data drive circuit and the scan drive circuit in the drive chip drive the first screen 12, the second screen 14 and the third screen 16 to show images according to the received signals.

Furthermore, the system main board 22 comprises function module, such as a first shooting module, a second shooting module, a slide unlock module. The first shooting module is electrically connected to the camera head 50 and the first screen 12 at the rear surface 204, and after the camera head 50 shoots or record images, the first shooting module processes the image signals and sends the same to the first screen 12 to show images; the second shooting module is electrically connected to the camera head 50 and the second screen 14 at the rear surface 204, and after the camera head 50 shoots or record images, the second shooting module processes the image signals and sends the same to the second screen 14 to show images. The flexible display apparatus only needs one camera to possess the selfie and normal image shooting functions. The slide unlock module is electrically connected to the third screen 16. The user touches the third screen 16 and performs specific movement to unlock the flexible display apparatus. The multiple screens of the flexible display apparatus does not only increase the display region but also realize the multifunction display in cooperation with the respective internal function apparatus and ports of the flexible display apparatus.

In this embodiment, the flexible display apparatus further comprises a glass panel covering on the flexible display panel, which is employed to protect the flexible display panel. Specifically, the glass panel comprises a first part 32, a second part 34 and a third part 36 connecting the first part 32 and the second part 34, and the first part 32 covers the first screen 12, and the second part 34 covers the second screen 14, and the third part 36 covers the third screen 16. Furthermore, the first part 32 is tightly adhered on the first screen 12, and the second part 34 is tightly adhered on the second screen 14, and the curved arcs of the third part 36 and the third screen 16 are the same, and the third part 36 is tightly adhered on the third screen 16, too. The glass panel protects the first screen 12, the second screen 14 and the third screen 16 to prevent the damage due to scratches in the usage process. Particularly, after the display panel is coated with an ITO conductive thin film, the flexible display apparatus is integrated with the touch control function. The user can directly touch the glass panel and can accomplish the operation to the flexible display apparatus.

In one preferred embodiment, the first part 32, the second part 34 and the third part 36 are in one piece, and convenient to process for formation, and beneficial for assembly.

In this embodiment, the flexible display apparatus further comprises a lateral side outer shell 40, and the lateral side outer shell 40 is connected with the glass panel, and the lateral side outer shell 40 and a sectional side of the glass panel form an enclosed pattern and accommodate the main body 20 and the flexible display panel inside. Specifically, the first part 32 of the glass panel comprises a first edge 302 away from the third part 36, and the second part 34 comprises a second edge 304 away from the third part 36, and the lateral side outer shell 40 connects the first edge 302 and the second edge 304, and thus to form an enclosed pattern with the sectional side of the glass panel. In one embodiment, the lateral side outer shell 40 is manufactured by non metal material, such as plastics, rubber and ceramic. In other embodiment, the lateral side outer shell 40 also can be manufactured with a metal material, and a plurality of openings are formed in the lateral side outer shell 40 of the metal material to prevent the lateral side outer shell 40 from blocking signals transmitting from and to an antenna installed on the main body 20. The enclosed accommodating space formed by the lateral side outer shell 40 and the glass panel accommodates the main body 20 and the flexible display panel inside to act the function of protecting the main body 20 and the flexible display panel.

In this embodiment, the main body 20 further comprises a battery 24. The battery 24 is installed in a battery 24 jar of the system main board 22, and located between the system main board 22 and the second screen 14. Specifically, the battery 24 jar is located at one side of the system main board 22 facing the second screen 14, and the battery 24 and the system main board 22 are accommodated together inside the enclosed accommodating space formed by the lateral side outer shell 40 and the glass panel after the battery 24 is installed in the battery 24 jar.

Furthermore, the lateral side outer shell 40 is detachably connected on the first edge 302 and the second edge 304. Detaching the lateral side outer shell 40 is convenient for installation or remove of components, such as the battery 24, the memory expansion card or sim card. In one embodiment, the edge of the lateral side outer shell 40 extends out with a plurality of protruding connection keys. A plurality of connecting grooves are correspondingly configured at the first edge 302 and the second edge 304 of the glass panel. With the cooperation of the connection keys and the connecting grooves, the lateral side outer shell 40 is connected to the glass panel.

The first screen 12, the second screen 14 and the third screen 16 are respectively located at the front surface 202, the rear surface 204 and the lateral side 206 of the main body 20 of the flexible display apparatus to enlarge the display region of the flexible display apparatus; the first screen 12, the second screen 14 and the third screen 16 are driven to work with the drive chip of the non display part 10 and can independently show images to realize the multifunction display, and the appearance is novel to attract consumers.

Figure 6:
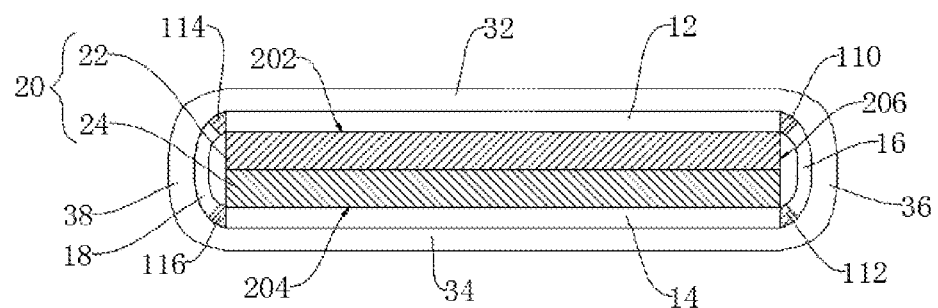
FIG. 6 is a sectional view diagram of a flexible display apparatus provided by the second embodiment of the present application.

FIG. 6 is a sectional view diagram of a flexible display apparatus provided by the second embodiment of the present application. As shown in figure, the difference between this embodiment and the first embodiment is that the flexible display panel further comprises a fourth screen 18, and the fourth screen 18 connects the first screen 12 and the second screen 14. The first screen 12, the second screen 14, the third screen 16 and the fourth screen 18 are connected in sequence. The sections form an enclosed circle to accommodate the main body 20 inside. Furthermore, the flexible display panel further comprises a third bent part 114 and a fourth bent part 116, which are respectively employed to connect the first screen 12 with the fourth screen 18 and to connect the second screen 14 with the fourth screen 18. The third bent part 114 and the fourth bent part 116 are manufactured with plastic material of better bendability. On one hand, they are employed to bear the most of the bent stress of the bent angles. On the other hand, they are employed to separate the first screen 12, the second screen 14 and the fourth screen 18.

In this embodiment, the glass panel further comprises a fourth part 38. The fourth part 38 connects the first part 32 and the second 34, and covers the fourth screen 18. Furthermore, the curved arcs of the fourth part 38 and the fourth screen 18 are the same, and the fourth part 38 is tightly adhered on the fourth screen 18. The glass panel protects the first screen 12, the second screen 14, the third screen 16 and the fourth screen 18 to prevent the damage due to scratches in the usage process. Particularly, after the display panel is coated with an ITO conductive thin film, the flexible display apparatus is integrated with the touch control function. The user can directly touch the glass panel and can accomplish the operation to the flexible display apparatus.

The first screen 12, the second screen 14, the third screen 16 and the fourth screen 18 are respectively located at the front surface 202, the rear surface 204 and the two lateral sides 206 of the main body 20 of the flexible display apparatus to enlarge the display region of the flexible display apparatus; the first screen 12, the second screen 14 and the third screen 16 are driven to work with the drive chip of the non display part 10 and can independently show images to realize the multifunction display, and the appearance is novel to attract consumers.

Above are embodiments of the present application, which does not limit the scope of the present application. Any modifications, equivalent replacements or improvements within the spirit and principles of the embodiment described above should be covered by the protected scope of the invention.

What is claimed is:

1. A flexible display apparatus, wherein the flexible display apparatus comprises a main body and a flexible display panel, and the flexible display panel comprises a non display part, a first screen, a second screen and a third screen, and the first screen and the second screen are oppositely located, and the third screen is connected between the first screen and the second screen, and the non display part is connected to one side of the display region, and the non display part is employed to be installed with a drive chip, and the drive chip is employed to drive the first screen, the second screen and the third screen to show images, and the main body comprises a front side, a rear side and a lateral side connecting the front side and the rear side, and the first screen is adhered to the front side, and the second screen is adhered to the rear side, and the third screen is located on the lateral side;

wherein a first bent part is connected between the first screen and the third screen so that the first screen and the third screen are separated from each other by the first bent part and a second bent part is connected between the second screen and the third screen so that the second screen and the third screen are separated from each other by the second bent part; and wherein the main body comprises a system main board, and the system main board is connected to the flexible display panel through a flexible circuit board and controls the drive chip to drive the flexible display panel to show images.

2. The flexible display apparatus according to claim 1, wherein a metal line is configured in each of the first bent part and the second bent part to electrically connect the first screen, the second screen and the third screen.

3. The flexible display apparatus according to claim 1, wherein either of the first screen, the second screen and the third screen is coated with a transparent conductive thin film layer, which is employed to form touch control units, and the non display part is configured with a touch control chip, and the touch control chip is electrically connected to the touch control units to realize a touch control function of the flexible display panel.

4. The flexible display apparatus according to claim 1, wherein the flexible display apparatus further comprises a glass panel covering on the flexible display panel, which is employed to protect the flexible display panel.

5. The flexible display apparatus according to claim 4, wherein the glass panel comprises a first part, a second part and a third part connecting the first part and the second part, and the first part and the second part are oppositely located, and the first part covers the first screen, and the second part covers the second screen, and the third part covers the third screen.

6. The flexible display apparatus according to claim 5, wherein the flexible display apparatus further comprises a lateral side outer shell, and the first part comprises a first edge away from the third part, and the second part comprises a second edge away from the third part, and the lateral side outer shell connects the first edge and the second edge, and the lateral side outer shell and a sectional side of the glass panel form an enclosed pattern and accommodate the main body and the flexible display panel inside.

7. The flexible display apparatus according to claim 1, wherein the main body further comprises a battery, and the battery is installed in a battery jar of the system main board, and located between the system main board and the second screen.

* * * * *